United States Patent [19] [11] 4,405,935
Baji et al. [45] Sep. 20, 1983

[54] SOLID-STATE IMAGING DEVICE

[75] Inventors: Toru Baji, Kokubunji; Norio Koike, Tokyo; Toshihisa Tsukada, Sekimachi; Iwao Takemoto, Hinodemachi; Hideaki Yamamoto; Yukio Takasaki, both of Hachioji, all of Japan

[73] Assignee: Hitachi, Ltd., Tokyo, Japan

[21] Appl. No.: 227,679

[22] Filed: Jan. 23, 1981

[30] Foreign Application Priority Data

Jan. 23, 1980 [JP] Japan .................................. 55-5756

[51] Int. Cl.³ .......................................... H01L 27/14
[52] U.S. Cl. ....................................... 357/31; 357/30; 357/23
[58] Field of Search ............................. 357/31, 30, 23

[56] References Cited

U.S. PATENT DOCUMENTS 4,021,844  5/1977  Gilles ................................... 357/31
4,268,845  5/1981  Koike ................................ 357/31 X Primary Examiner—Martin H. Edlow
Attorney, Agent, or Firm—Antonelli, Terry & Wands

[57] ABSTRACT

Disclosed is a solid-state imaging device having a semiconductor integrated circuit in which a plurality of switching elements for selecting positions of picture elements and scanners for turning "on" and "off" the switching elements in time sequence are disposed on an identical substrate, a photoconductive film which is disposed on the integrated circuit and which is connected to one end of each of the switching elements, and a light transmitting electrode which is disposed on the photoconductive film, characterized at least in that a breakdown voltage of a junction formed between the semiconductor substrate and an impurity region which has a conductivity type opposite to that of the semiconductor substrate and which stores therein carriers attendant upon incidence of light is made smaller than a breakdown voltage between the storing first impurity region of said each switching element and a second impurity region thereof which forms a signal leading-out portion.

6 Claims, 8 Drawing Figures

SOLID-STATE IMAGING DEVICE

BACKGROUND OF THE INVENTION

1. Field of the Invention

This invention relates to improvements in a solid-state imaging device in which photoelectric elements and scanners for selecting the elements are integrated on an identical semiconductor substrate.

2. Description of the Prior Art

As an example of a solid-state imaging device, there has been one in which only scanners and groups of switches connected thereto are arrayed on a semiconductor substrate and are overlaid with a thin photoconductive film for the photoelectric conversion function. Owing to the double-layer structure in which photoelectric elements are formed over the scanners and the groups of switches, this device enhances the packaging density of picture elements (in other words, the resolving power) and the light receiving efficiency more and is therefore expected as a solid-state imaging device in the future. Examples of the solid-state imaging device of this type are disclosed in Japanese Published Unexamined Patent Application No. 51-10715 (filed July 5, 1974); INTERNATIONAL ELECTRON DEVICES MEETING, December 1979, pp. 134–136; etc. FIG. 1 shows a construction for explaining the principle of the device. In the figure, numeral 1 designates a horizontal scanner which turns "on" and "off" horizontal position selecting switches 3, numeral 2 a vertical scanner which turns "on" and "off" vertical position selecting switches 4, numeral 5 a photoelectric element which utilizes a thin photoconductive film, numeral 6 a supply voltage terminal which serves to drive the photoelectric elements 5, numerals 10-1 and 10-2 signal output lines, and letter R a resistor, FIG. 2 shows a sectional structure of a photoelectric conversion region in FIG. 1, in which numeral 5' indicates a thin photoconductive film, numeral 6' indicates a supply voltage applied through a transparent electrode 7, numeral 4' indicates a vertical switch and numeral 8 an insulating film. Numeral 11 indicates a semiconductor substrate, numeral 12 indicates a gate electrode, and numeral 13 indicates an electrode (of, for example, Al) which is held in ohmic contact with one and 9 (a diffused region formed by the use of an impurity opposite in the conductivity type to the substrate 11) of the switch 4'. When an optical image is formed on the thin photoconductive film through a lens, the resistance value of the photoconductive film varies depending upon the light intensities of the optical image. A voltage variation corresponding to the optical image appears at the end 9 of the vertical switch 4 (4'), and this variation is derived as a video signal from an output terminal OUT through the signal output lines 10-1 and 10-2. Shown at numeral 16 is an impurity diffused region which has the same conductivity type as that of the region 9 and which is connected to the signal output line 10-1.

SUMMARY OF THE INVENTION

In a solid-state imaging device, blooming, in a unique shape determined by the scanning system, can develop. In the foregoing example etc., the voltage of the region 9 in FIG. 2 rises in response to a spot of high illumination and exceeds the punch-through voltage of the switch. Therefore, signal charges pour from the region 9 to the region 16 connected with the line 10-1, to give rise to the blooming in the shape of stripes extending vertically on an imaging screen. It degrades the picture quality conspicuously and is especially problematic.

This invention is very effective for suppressing such blooming.

According to this invention, a solid-state imaging device having a semiconductor integrated circuit in which a plurality of switching elements for selecting positions of picture elements and scanners for turning "on" and "off" the switching elements in time sequence are disposed on an identical substrate, a photoconductive film which is disposed on the integrated circuit and which is connected to one end of each of the switching elements, and a light transmitting electrode which is disposed on the photoconductive film, is characterized at least in that a breakdown voltage of a junction formed between the semiconductor substrate and an impurity region which has a conductivity type opposite to that of the semiconductor substrate and which stores therein carriers attendant upon incidence of light is made smaller than a breakdown voltage between the storing first impurity region of said each switching element and a second impurity region thereof which forms a signal leading-out portion.

DETAILED DESCRIPTION OF THE PREFERRED EMBODIMENTS

Figure 2:
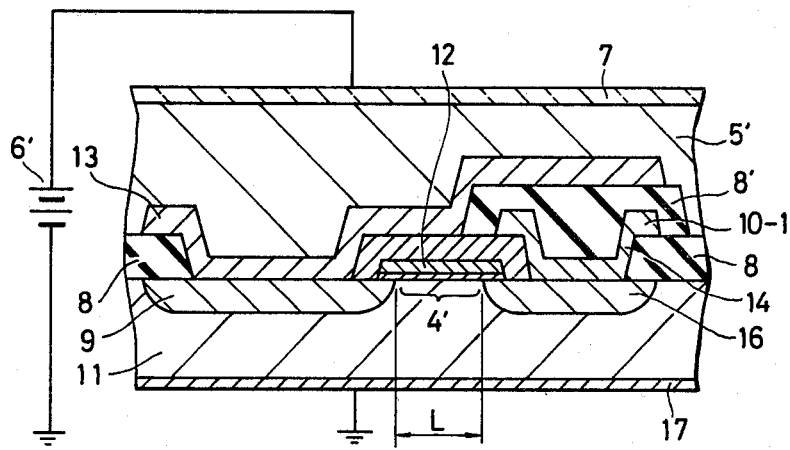
FIG. 2 is a sectional view showing a picture element of an embodiment of a solid-state imaging device of this invention which employs a photoconductive film as a photoelectric conversion portion.

The essential point of this invention consists in that, in a solid-state imaging device whose fundamental construction is exemplified in FIG. 2, the relationship between the punch-through voltage of the switching element 4' (the breakdown voltage, $BV_{DS}$ between the impurity diffused regions 9 and 16 which constitute the switch 4') and the breakdown voltage ($BV_j$) of a diode junction which is formed between the semiconductor substrate 11 and the impurity region 9 in the substrate is made:

$$BV_{DS} > BV_j$$

Figure 1:
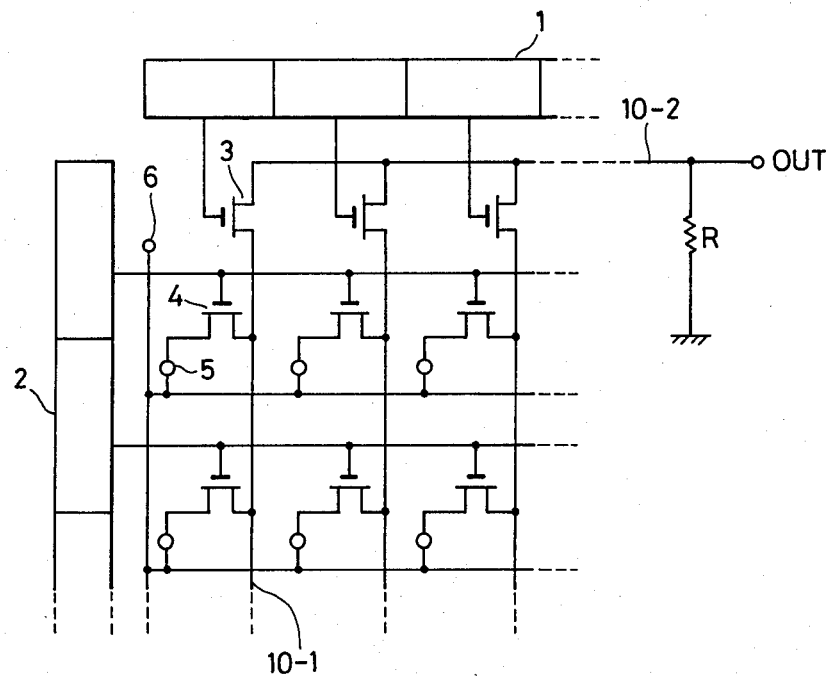
FIG. 1 is a diagram showing the outline of a solid-state imaging device which employs a photoconductive film as a photoelectric conversion portion.
Figure 3:
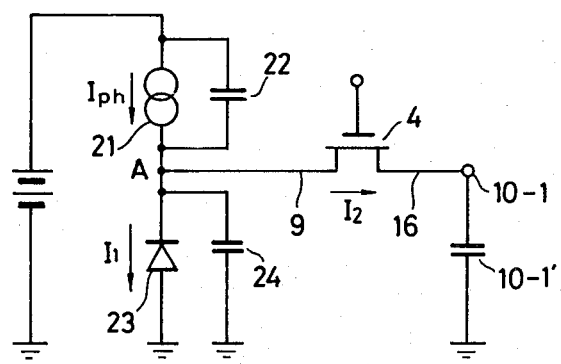
FIGS. 3 and 4 are equivalent circuit diagrams of picture element portions.
Figure 4:
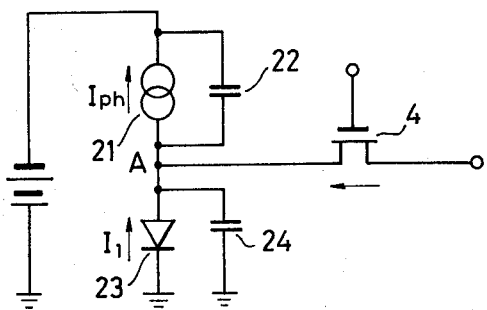

FIG. 3 shows an equivalent circuit of one picture element. Numeral 4 indicates the same switch as in FIG. 1. Parts 21 and 22 correspond to the thin photoconductive film 5, and are an equivalent photo current source and the capacitance of the thin photoconductive film 5 respectively. Parts 23 and 24 correspond to the portion of the impurity region 9, and are a diode formed by a p-n junction or n-p junction and the junction capacitance thereof respectively. FIG. 4 shows an equivalent circuit in the case where the conductivity types of the semiconductor material and the impurity regions are reversed. The same symbols indicate the same parts. Although the senses of currents etc. become opposite, the electrical fundamental operations may be similarly considered. A part 10-1' is a capacitance parasitic to the vertical output line 10-1.

Immediately after external light has been read, the potential of a point A in FIG. 3 is reset to a video bias voltage $V_V$. Thereafter, the capacitance 22 ($C_a$) of the thin photoconductive film is discharged and the diffusion capacitance 24 ($C_d$) is charged by the photo current $I_{ph}$ of the thin photoconductive film over a storage time $t_s$. As carriers created by the light are stored into the capacitances $C_a$ and $C_d$ in such manner, the potential of the point A rises gradually. In case of the present device, the potential of the point A is expressed as:

$$V = \frac{I_{ph} \cdot \tau_s}{C_a + C_d}$$

where $I_{ph}$ denotes the photo current of the thin photoconductive film, $\tau_s$ the storage time (33 msec in ordinary TV cameras), and $C_a$ and $C_d$ the capacitances of the thin photoconductive film and the diffused portion respectively.

In reading out the stored signal charges, the switch 4 is turned "on" to transmit the signal charges to the parasitic capacitance 10-1' of the vertical signal line. Subsequently, the switch 3 is turned "on" to read out the charges through the load resistor R connected to the output line 10-2.

Now, by fulfilling the condition of $BV_{DS} > BV_j$ as stated previously, an effect described below can be achieved. The difference between the voltages $BV_{DS}$ and $BV_j$ is practically made approximately 0.5-1 V or more, though it is dependent also upon design.

With rise in the intensity of illumination, the potential of the point A rises. Since, however, the breakdown voltage $BV_{DS}$ of the switching element 4 (that is, 4' in FIG. 2) is set to be greater than the breakdown voltage $BV_j$ of the junction diode 23, the junction diode causes breakdown first. Accordingly, the potential of the point A does not rise more. The signal current is also saturated by the illumination at that time.

Also excess carriers created at an extraordinarily high illumination pour entirely onto the side of the substrate 11 owing to the aforecited breakdown of the junction diode. Accordingly, the blooming which has been observed in the prior-art device and which is attributed to the leakage of the excess carriers to the signal line does not appear.

Figure 5:
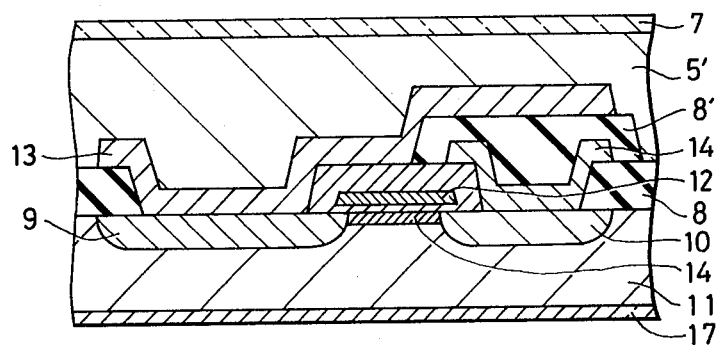
FIGS. 5, 6 and 7 are sectional views of essential portions showing different embodiments of this invention.

As methods for establishing the foregoing condition of $BV_{DS} > BV_j$, there are the following ones:

(1) The impurity concentration $N_a$ of the channel portion of the switch 4 is made high. FIG. 5 shows a sectional view of a device illustrative of this structure. The sectional view corresponds to one picture element. Numeral 14 indicates the region whose impurity concentration is made high. The others are the same as in FIG. 2. The breakdown voltage $BV_{DS}$ can be raised.

Figure 6:
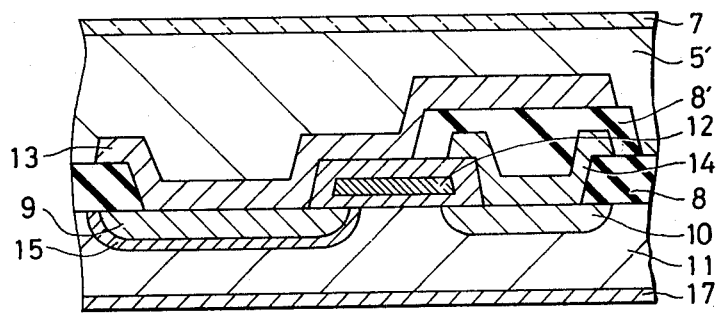

(2) A heavily-doped region is disposed on the vicinity of the impurity region 9. In this case, the heavily-doped region may be disposed over the whole area of the impurity region 9 or may well be disposed over only a part thereof. FIG. 6 is a sectional view of a device showing an example in which the heavily-doped region above stated is formed. Also this sectional view corresponds to the portion of one picture element. Numeral 15 indicates the heavily-doped region which is disposed in the vicinity of the impurity region 9. The others are the same as in FIG. 2.

In general, the semiconductor substrate to be used has an impurity concentration on the order of $5 \times 10^{14} - 5 \times 10^{15}/cm^3$. In the above examples, accordingly, the impurity concentrations are usually made approximately $10^{16} - 10^{18}/cm^3$.

The impurity region 9 and the heavily-doped region 15 exemplified in FIG. 6 are satisfactorily formed by the double diffusion process which is employed in the field of general semiconductor devices.

Figure 7:
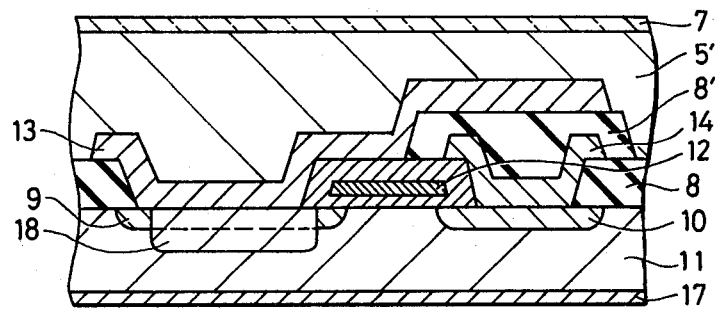

FIG. 7 is a sectional view of a device showing an example in which a heavily-doped region 18 is disposed at a part of the impurity region 9. The same symbols as in FIG. 2 indicate the same parts.

Since the semiconductor substrate usually has the impurity concentration on the order of $5 \times 10^{14} - 5 \times 10^{15}/cm^3$, a p+-type impurity region having an impurity concentration of approximately $10^{16} - 10^{17}/cm^3$ is formed as the heavily-doped region 18 by diffusing boron. Subsequently, an impurity region having an impurity concentration of at least $10^{20}/cm^3$ is formed as the n-type impurity region 9 by diffusing phosphorus. In an example, characteristics of $BV_j = 16$ V and $BV_{DS} = 23$ V were obtained at a channel length of 5 μm, and the blooming was prevented.

In forming the impurity regions, techniques in the field of ordinary semiconductor devices are satisfactorily used.

There are the following methods. Both have some difficulties.

(3) The impurity concentration $N_A$ of the semiconductor substrate 11 is made high. In general, it is made approximately $10^{16} - 10^{18}/cm^3$. Thus, it is possible to raise the breakdown voltage $BV_{DS}$ and simultaneously lower the breakdown voltage $BV_j$. This method, however, has the difficulty that the threshold voltage of the switching element rises.

(4) As another method, the channel length of the switch 4 is made great. However, the increase of the channel length results in enlarging the size of one picture element and lowering the packaging density of picture elements. In actuality, accordingly, channel lengths have their upper limit determined by the size of the picture element, and this method is comparatively difficult to use.

Figure 8:
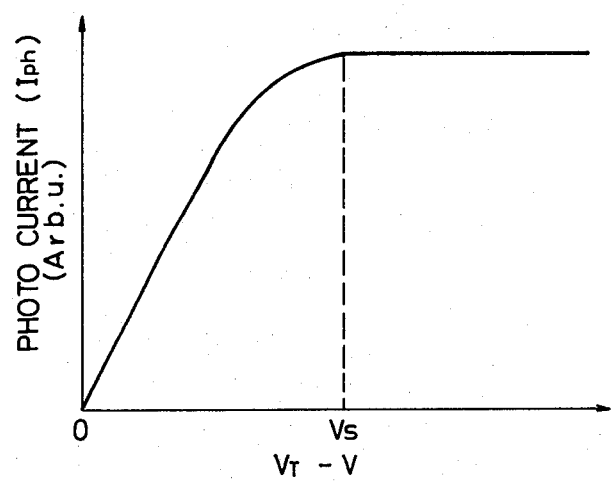
FIG. 8 is a diagram showing the relationship between the photo current and the voltage applied to a photoconductive film.

In the solid-state imaging device of this invention, it is desirable to use the photoconductive film in the saturation region stated before. FIG. 8 is a diagram showing the relationship between the photo current ($I_{ph}$) and the voltage applied to the photoconductive film. $V_S$ indicates the saturation point. A reduced after-image, a high quantum efficiency and a short lag can be realized by the use under this state. The reason why such characteristics are attained in the saturation region by applying a sufficient voltage (electric field) of or above $V_S$ is that the photo carriers in the photoconductive film which are generated in the vicinity of the transparent electrode migrate to a counter electrode quickly without being trapped halfway owing to the great electric field.

Now, in the equivalent circuit of FIG. 3, the diode 23 has the breakdown voltage ($BV_j$), and hence, the maximum value of the potential of the point A is $BV_j$. The minimum value of the voltage applied to the photoconductive film is expressed as $V_T - BV_j$ (where $V_T$: bias voltage). In order to use the photoconductive film in the saturation region, accordingly, $V_T - BV_j \geq V_S$ (where $V_S$: saturation point of the voltage applied to the photoconductive film) may be satisfied.

Therefore, the condition of the breakdown voltage $BV_j$ becomes $V_T-V_S \geqq BV_j$.

In an example of $V_S=30$ V, cases where $(V_T-V)$ is 15 V and where it is 40 V will be compared. At 5 seconds after the interception of light, 6% of a photo current at the interception remains in the former case, whereas about 0.2% remains in the latter case. In this manner, the measure is extraordinarily effective.

Examples will now be described.

The structure of the examples is as shown in FIG. 5. A scanning circuit portion including a switching circuit etc. to be formed on a semiconductor substrate was produced with processes for ordinary semiconductor devices. A thin $SiO_2$ film of approximately 800 Å was formed on a p-type silicon substrate 11, and an $Si_3N_4$ film of approximately 1,400 Å was formed on predetermined positions of the $SiO_2$ film. The $SiO_2$ film was formed by the conventional CVD process, and the $Si_3N_4$ film by the CVD process in which $Si_3N_4$ and $N_2$ were caused to flow. Subsequently, the silicon was locally oxidized in an atmosphere of $H_2:O_2=1:8$, to form an $SiO_2$ layer 8. This method is the local oxidation of silicon for isolating elements as is generally termed "LOCOS". The $Si_3N_4$ film and the $SiO_2$ film stated above were once removed, and a gate insulating film for each MOS transistor was formed of an $SiO_2$ film.

Subsequently, a gate portion 12 of polycrystalline silicon and diffused regions 9 and 16 were formed, and an $SiO_2$ film was further formed thereon. In this film, an electrode lead-out opening for the impurity region 16 was provided by etching. Al was evaporated 8,000 Å as an electrode 10-1. Further, an $SiO_2$ film 8' was formed to 7,500 Å. Subsequently, on the impurity region 9, an electrode lead-out opening for the region 9 was provided by etching, and Al or Mo was evaporated 1 μm as an electrode 13. Herein, the electrode 13 was formed to be so extensive as to cover the regions 9 and 16 and the gate portion. This is because the incidence of light on a signal processing region between the elements becomes a cause for the blooming and is undesirable.

A recombination layer of $Sb_2S_3$ or the like may be optionally disposed on the aluminum electrode 13.

The manufacture of the semiconductor device portion described above may be satisfactorily relied on the ordinary MOSIC manufacturing process as disclosed in, for example, the official gazette of Japanese Published Unexamined Patent Application No. 53-122316.

Subsequently, the semiconductor body prepared by the steps thus far described was installed on a magnetron type sputtering equipment. An atmosphere used was a mixed gas consisting of Ar and hydrogen and was under 0.2 Torr. The hydrogen content was 6 mol-%. As a sputtering target, silicon was used. Reactive sputtering was carried out at a frequency of 13.56 MHz and an input power of 300 W, to deposit a thin amorphous silicon film 5' containing hydrogen on the semiconductor body to a thickness of 500 nm. The hydrogen content of the thin amorphous film was 20 atomic-%, and the resistivity thereof was $5 \times 10^{13}$ Ω·cm.

Subsequently, $SnO_2$ being 1,000 Å-2 μm thick was formed as an electrode 7. A second electrode 17 was formed of an Au layer on the rear surface of the semiconductor substrate. In general, the semiconductor substrate is grounded with this electrode.

Needless to say, the photoconductive film 5' is not restricted to this example. It may be any of various films, for example, an Se-As-Te film or a multilayered film consisting of layers of the components, and a two-element film of Zn-Se and Zn-Cd-Te.

Table 1 sums up the parameters of the impurity concentration of the semiconductor substrate 11 (boron was introduced by the ion implantation), the channel length of the switching element, etc. Data Nos. 1-3 are examples of the structure in which the high concentration impurity region was disposed only in the channel portion of the switch 4. In this case, the impurity concentration of the substrate was $\sim 1 \times 10^{15}/cm^3$. The depth of the the high concentration impurity region sufficed to be approximately 0.05-0.5 μm.

Data Nos. 4-5 are comparative examples in the case where the impurity concentration of the substrate was $1 \times 10^{15}/cm^3$.

The impurity region 9 (and 10) had its impurity concentration made $10^{19}-10^{20}/cm^3$ and its diffusion depth made 0.5-1 μm.

This invention has thus far been described in connection with the examples in which the switching elements etc. are disposed directly in the semiconductor substrate. Needless to say, however, this invention is also applicable to, for example, a structure wherein a well of the opposite conductivity type is formed in a semiconductor substrate and wherein switching elements etc. similar to those described before are disposed in the well.

TABLE 1

| Data No. | | $N_A$ (/cm³) | Channel length (μm) | $BV_j$ (V) | $BV_{DS}$ (V) |
|---|---|---|---|---|---|
| 1 | | $5 \times 10^{16}$ | 15 | 16 | 20 or above |
| 2 | | $5 \times 10^{16}$ | 8 | 16 | 18 or above |
| 3 | | $5 \times 10^{16}$ | 5 | 16 | 17 or above |
| Comparative Ex. | 4 | $1 \times 10^{15}$ | 15 | 27 | 20 or below |
| | 5 | $1 \times 10^{15}$ | 4 | 27 | 17 or below |

What is claimed is:

1. A solid-state imaging device comprising: a semiconductor integrated circuit in which a plurality of switching elements are disposed on a semiconductor substrate, the switching elements being adapted for selecting positions of picture elements; a photoconductive film which is disposed over the integrated circuit and which is connected to one end of each of the switching elements; and a light transmitting electrode which is disposed on the photoconductive film; each of the switching elements including first and second impurity regions in the semiconductor substrate which have a conductivity type opposite to that of the semiconductor substrate, one of the impurity regions acting to store carriers generated with incidence of light; and means for controlling current in a current path between the two impurity regions; wherein the breakdown voltage ($BV_j$) of the junction which is formed between said semiconductor substrate and the impurity region which stores carriers generated with incidence of light is made smaller than the breakdown voltage ($BV_{DS}$) between said first and second impurity regions.

2. A solid-state imaging device according to claim 1, wherein a semiconductor region between said first and second impurity regions has the same conductivity type as that of said semiconductor substrate and has an impurity concentration higher than that of said semiconductor substrate, whereby $BV_j < BV_{DS}$ is established.

3. A solid-state imaging device according to claim 1, wherein a region which has the same conductivity type as that of said semiconductor substrate and which has an impurity concentration higher than that of said semiconductor substrate is disposed in the vicinity of the impurity region for storing carriers generated with incidence of light, whereby $BV_j < BV_{DS}$ is established.

4. A solid-state imaging device according to claim 3, wherein the region with the higher impurity concentration surrounds the impurity region for storing carriers.

5. A solid-state imaging device according to claim 3, wherein the region which has the higher impurity concentration is disposed in contact with a part of said impurity region for storing carriers generated with incidence of light.

6. A solid-state imaging device according to claim 1, wherein scanners are arranged to turn the switching elements "on" and "off" in time sequence are disposed on the semiconductor substrate.

* * * * *